(12) United States Patent
Kiefer

(10) Patent No.: US 8,410,867 B2
(45) Date of Patent: Apr. 2, 2013

(54) FILTER, ESPECIALLY FOR FILTRATION OF ELECTROMAGNETIC INTERFERENCE

(75) Inventor: Arno Kiefer, Bad Lippspringe (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 476 days.

(21) Appl. No.: 12/748,832

(22) Filed: Mar. 29, 2010

(65) Prior Publication Data

US 2010/0244986 A1 Sep. 30, 2010

(30) Foreign Application Priority Data

Mar. 30, 2009 (DE) .......................... 10 2009 014 859

(51) Int. Cl.
| | |
|---|---|
| H03H 7/00 | (2006.01) |
| H03H 7/06 | (2006.01) |
| H05K 1/02 | (2006.01) |
| H05K 1/18 | (2006.01) |

(52) U.S. Cl. ........................................ 333/185; 333/167

(58) Field of Classification Search .................. 333/167, 333/169, 170, 171, 174, 175, 181, 182, 183, 333/185

See application file for complete search history.

(56) References Cited

U.S. PATENT DOCUMENTS

| | | | | |
|---|---|---|---|---|
| 4,188,598 A | * | 2/1980 | Hunt | ............................. 333/207 |
| 4,275,368 A | * | 6/1981 | Wimmer | ....................... 333/167 |
| 4,319,207 A | | 3/1982 | Gignoux | |
| 5,619,079 A | * | 4/1997 | Wiggins et al. | ................. 307/89 |
| 2003/0232600 A1 | | 12/2003 | Montgomery et al. | |
| 2007/0296277 A1 | * | 12/2007 | Lee et al. | ...................... 307/105 |

FOREIGN PATENT DOCUMENTS

| | | |
|---|---|---|
| DE | 1 250 891 B | 9/1967 |
| DE | 203 16 051 U1 | 1/2004 |

* cited by examiner

*Primary Examiner* — Ryan Johnson

(74) *Attorney, Agent, or Firm* — Roberts Mlotkowski Safran & Cole, P.C.; David S. Safran

(57) ABSTRACT

A filter for filtering of electromagnetic interference, with a base element, with at least one electrical filter component and with at least two input terminal contacts and at least two output terminal contacts for connection of an electric line, the input terminal contacts being connected to the output terminal contacts by conductor paths located on the base element. In the filter, a simple configuration and flexible use are ensured by each conductor path having at least two longitudinal contacts, via which a filter component can be electrically connected to a conductor path such that the electrical connection of the conductor path leads between the two longitudinal contacts by the filter component, and each conductor path has at least one cross contact so that two conductor paths are electrically connected to one another by way of a filter component when the filter component is electrically connected to the cross contacts.

20 Claims, 4 Drawing Sheets

FILTER, ESPECIALLY FOR FILTRATION OF ELECTROMAGNETIC INTERFERENCE

BACKGROUND OF THE INVENTION

1. Field of the Invention

The invention relates to a filter, especially for filtration of electromagnetic interference, with a base element, with at least one electrical filter component and with at least two input terminal contacts and at least two output terminal contacts for connection of the conductors of an electric line, the input terminal contacts being connected to the output terminal contacts by way of conductor paths which are located on the base element. Moreover, the invention relates to a base element for a filter, with at least two input terminal contacts and at least two output terminal contacts for connection of the conductors of an electrical line, the input terminal contacts being connected to the output terminal contacts via conductor paths.

2. Description of Related Art

The effect of electromagnetic interference on an electrical system can be minimized or prevented by filters, so-called EMC (electromagnetic compatibility) filters. EMC filters, which are generally lowpass filters, filter both emissions and also system emissions, i.e., they are used, on the one hand, to protect a system against the effect of external electromagnetic noise signals, on the other hand, they protect other systems or electrical devices against noise signals which are caused by the system. With EMC filters, an attempt is made to achieve poor impedance matching between the input side and output side so that maximum reflection of the noise signals arises. EMC filters are often provided on the external electrical lines of a system, for example, on the feed line. The main application of EMC filters is, for example, frequency converters.

An EMC filter must be tuned individually to the system configuration and noise signal characteristic of an electrical system so that adequate filter action is achieved. Therefore, manufacturers of EMC filters must offer a large selection of different filters in order to meet the needs of as many applications as possible. A host of filters are offered which are suitable for the most varied applications and noise signals, the filters being preconfigured components which can be directly integrated into the systems to be protected. The filters are chosen mainly based on their electrical specifications, for example working voltage and maximum allowable current.

Individual filter designs are also frequently offered for complex systems. With the objective of being able to reduce the selection of different filters and to simplify the production of an individual filter design, German Utility Model DE 203 16 051 U1 describes an EMC filter for filtering of electromagnetic interference on electric lines in which the mechanical structure is modular. The known filter has a central frame which forms the mechanical base of the EMC filter and on which the individual components can be mounted. Mounting takes place such that the individual components are mounted on the central frame in isolation from one another and are connected at least partially to one another by cabling. Preferably, a solder connection is proposed for the connection.

The configuration according to German Utility Model DE 203 16 051 U1 has the disadvantage that the components attached to the central frame must be brought into contact among one another with high wiring effort, and the configuration of the filter cannot be changed after mounting.

SUMMARY OF THE INVENTION

Therefore, a primary object of this invention is to devise a filter which can be easily configured and which is flexible in its use.

The aforementioned object in accordance with the invention is achieved in a filter of the initially named type by there being at least two longitudinal contacts in each conductor path, via which a filter component can be electrically connected to a conductor path such that the electrical connection of the conductor path leads between the two longitudinal contacts by way of the filter component and that there is at least one cross contact in each of the conductor paths so that two conductor paths are electrically connected to one another by way of a filter component when the filter component is electrically connected to the cross contacts of the two conductor paths.

The filter in accordance with the invention has the advantage that it can be matched variably to different or changing applications without the filter having to be dismounted and replaced by an entirely new filter. The filter action after installation of the base component can be tuned and matched to the corresponding noise characteristic of the respective electrical system by mounting of one or more electrical filter components. Depending on the desired filter action, electrical filter components can be placed via two longitudinal contacts in one conductor path or the two conductor paths are electrically connected to one another by the cross contacts by way of one electrical filter component. Filter dimensioning can thus be done as necessary directly on site or can be adapted when the conditions change.

The longitudinal contacts are provided such that, between two longitudinal contacts of a conductor path which are assigned to one another, there is an electrically conductive connection when a filter component is not connected to the two longitudinal contacts. With the filter component mounted the electrical connection takes place via the filter component, the direct electrical connection between the two longitudinal contacts is thus interrupted. The cross contacts of different conductor paths do not have an electrically conductive connection among one another by mounting a filter component between two cross contacts, an electrically conductive connection being established via the filter component. Since the longitudinal contacts and the cross contacts are preferably made mechanically identical, the longitudinal contact of one conductor path can consequently be used also as a cross contact for producing a cross connection to a cross contact or a longitudinal contact of another conductor path. This results in that, within the framework of this patent application, the terms "longitudinal contact" and "cross contact" are to be understood functionally with respect to their interaction with a filter component, and not mechanically.

The respective filter action of the filter depends on which and how many filter components are connected to the base element at which points of the conductor paths. Generally, the filter action thus arises by a combination of a plurality of filter components which according to the respective application are connected to the longitudinal contacts or cross contacts, i.e., are installed in the individual conductor paths. However, fundamentally, it is also possible that only one individual filter component is installed in a conductor path or between two conductor paths. The filter in accordance with the invention has the advantage that filter dimensioning can only take place directly on site and that, when the system configuration changes the filter need not be completely replaced, but simply one or more electrical filter components must be replaced, changed or additionally integrated, as a result of which the filter action changes. Once the filter has been installed, changes and improvements of the filter action can thus take place by replacing or adding filter components, even in current operation.

According to one advantageous configuration of the filter, it is provided that the base element has at least one further third conductor path. On this third conductor path, there is at least one cross contact which can make contact with a filter component so that contact to at least one of the other two conductor paths can be established via the filter component. The electrical cross connection between two conductor paths arises when a respective cross contact of a conductor path is electrically connected via a filter component to a cross contact of another conductor path.

In the configuration of the filter with three conductor paths, it has proven advantageous if two conductor paths have both longitudinal contacts and also cross contacts and the third conductor path has only cross contacts. Here, the third conductor path with its cross contacts is electrically connectable via a filter component to the cross contacts of at least one other conductor path so that a cross connection can be established via one filter component between at least two conductor paths. "Electrically connectable" means that there is a connection between the conductor paths via an electrical filter component. The configuration with three conductor paths is intended, for example, for single-phase networks. Accordingly, a first conductor, a neutral conductor and a protective conductor are connected to the three input and output terminal contacts.

The filter in accordance with the invention, in a corresponding configuration, is suited both for single-phase networks and also for three-phase networks. One preferred configuration, for example, for three-phase networks calls for a total of five conductor paths to be located on the base element. Four of these five conductor paths have both longitudinal and cross contacts, while the fifth conductor path has only cross contacts. The fifth conductor path, which has only cross contacts, can be electrically connected to at least one of the other four conductor paths via at least one filter component.

Another configuration calls for not only the conductor path which has only cross contacts to be electrically connected to one or more conductor paths, but also for the conductor paths which have both longitudinal and cross contacts to be electrically connectable among one another, individually or in a majority. This configuration is provided both for filters for three-phase networks with five conductor paths and also for filters of single-phase networks with three conductor paths.

The filter components with which the conductor paths can be connected can have a capacitance, an inductance or a resistance. However, filter components have been especially advantageous which have a capacitance and/or an inductance and/or a resistance, i.e., comprise a combination of the individual components, for example, a filter component in which one capacitor is wired to two reactors and one resistor.

Filter components which, for example, have frequently used combinations of individual components (hereinafter called combination filter components) have the advantage that, when the filter is set up, a complex filter action can be very quickly achieved by these combination filter components being mounted. The wired components which are already located in the combination filter component, consequently, need no longer be combined by a plurality of individual filter components which each have one component, but the combination of components is already prefabricated and achieves a filter action which is characteristic of the corresponding wiring.

According to one version of the invention, the individual components of a combination filter component are not internally wired to one another, but are arranged relative to one another on the base element only according to the mounting possibilities, so that when the combination filter component is mounted on the base element, complex wiring of the individual components is implemented via the conductor paths of the base element. Depending on the configuration, a connection only in the form of an electrical conductor within the combination filter component can also partially take place. Thus, a combination filter component can be configured, for example, such that when the combination filter component has been slipped onto the base element there is a reactor in the first conductor path, the first conductor path is additionally cross-connected via a capacitor to a second conductor path and two longitudinal contacts of the third conductor path are directly connected to one another via the combination filter component in that there is not any electrical component, but simply a conductor in the combination filter component at the corresponding position.

The combination filter components are preferably classified as coarse, medium and fine filters which have different lowpass behaviors so that noise signals with different filter qualities, especially above the line frequency, are filtered. Preferred components in the combination filter components are especially capacitors with different capacitances, coils or current-compensated reactors with different inductances, and different resistors. Using combination filter components can greatly reduce the cost and time for production of the required filter action.

Preferably, there is a handbook in which empirical values with respect to the filter action of individual combinations of filter components and combination filter components are documented, as a result of which achieving the desired filter action is enabled with relatively low costs, according to instructions. With a limited number of filter components, a range of different filter actions which is as large as possible is achieved, by which many applications can be accommodated.

By a combination of different or identical filter components on the base element, the filter in accordance with the invention can be flexibly adjusted to any noise signals. In order to additionally increase this flexibility, another configuration of the filter in accordance with the invention calls for the physical quantities of the reactors, capacitors or resistors which are provided in the filter components to be variably adjustable. In particular, the capacitance and/or the inductance and/or the resistance of a filter component is adjustable. The adjustability of the physical quantities of the filter components makes it possible that the filter components need not be replaced for minor changes of the noise signals or the system configuration, but that they can be adapted to the new configuration or the new noise characteristic by changing the physical quantities of the components.

Another advantageous configuration of the filter in accordance with the invention calls for the conductor paths of the base element to be made as printed conductors, the printed conductors preferably being vapor deposited on a plastic base element.

According to another advantageous configuration of the invention, the longitudinal contacts and the cross contacts are made as plug-in contacts, especially as sockets, so that the corresponding mating plug-in contacts, especially the filter components which have plug pins, can be easily slipped onto the base element. The combination filter components, depending on the configuration, have a plurality of plug pins for making contact with longitudinal contacts and cross contacts. In order to make the filter components still more flexible in their use, the plug pins are preferably attached to the filter component with a detachable mechanical connection, for example a screw connection. Depending on the respective application, some of the plug pins can be removed by the detachable connection in order to interrupt the electrical contact of individual components in a combination filter component in a controlled manner. Preferably, the detachable plug pins are color-coded for easier overview, for this purpose, especially ring-shaped color coding being provided on the periphery of the plug pins.

So that the filter components are protected against unintentional detachment from the base element, in addition to the electrical connection, there is advantageously a mechanical connection, for example, a catch or clip connection, between the filter component and the base element. Especially preferably, the electrical plug pins are made such that they implement a stable, preferably nonpositive mechanical connection, and at the same time, an electrical connection. In order to shield the filter component, on the one hand, against electromagnetic interference, and on the other, to prevent the filter component itself from emitting noise signals, the filter components can be located in a metallic housing or in a plastic housing with an applied metal layer.

In order to easily integrate the filter into an electrical system, for example, into a feed line, it is provided that the input terminal contacts and the output terminal contacts be made as plug-in contacts, preferably as sockets, so that the filter can be easily installed in an electrical system with little effort. Integration of the filter in accordance with the invention into an electrical system is also simplified in that the base element can preferably be mounted on a mounting rail, especially can be locked onto it. This mounting possibility of the base element on a mounting rail enables the filter in accordance with the invention to be mounted, for example, in a switchgear cabinet.

As part of an electrical system, the filter in accordance with the invention according to another preferred configuration is equipped with at least one optional overvoltage protection element. The overvoltage protection element is preferably made to be plugged in, for electrical connection, there being sockets on the base element and the overvoltage protection element having the corresponding plug pins. The sockets are wired within the base element to the conductor paths. The overvoltage protection elements can be overvoltage protection plugs known from the prior art which are sold especially by the assignee of the present application under the name PLUGTRAB PT.

Directly during mounting of the filter components on the base element, the filter action which has been attained at the time is not apparent; it is unknown how the current configuration of the filter will affect the noise signal. According to one preferred configuration of the filter, it is therefore provided that there is at least one, preferably two display elements on the base element which display feedback about the filter action depending on the type, number and position of the filter components which have been slipped onto the longitudinal contacts and/or onto the cross contacts. For this purpose, there is a circuit which balances the noise signal and filter performance, and delivers an output signal to the display element. Two differently colored light emitting diodes are especially preferred as display elements, and depending on the threshold value, they signal the presence of good or bad filter action. Alternatively, there can also be a luminous bar which, for example, lights up over its entire length when the filter action is poor and does not have any light display when good filter action is achieved. The luminous bar then becomes continuously shorter as the filter action becomes better.

According to one preferred configuration, it is provided that a cover can be mounted on the base element which shields the contacts against ambient effects, and thus, also offers protection against unintentional removal of the filter components. The cover can preferably be slipped onto the base element and can be mechanically attached by means of a plug connection or catch connection. The cover can then also be used for shielding of the filter or of the filter components mounted on the base element against electromagnetic noise signals. For this purpose, the cover is made either of metal or of plastic, the cover then being provided with a metal layer on the inside and/or on the outside. If the bottom of the base element is also provided with a metal layer, for example, vapor-coated with a metal layer, the filter is altogether shielded against noise signals from the outside, and moreover, it is ensured that the filter itself cannot emit noise signals either. In this way, the use of an additional metallic housing as an "EMC" housing can be abandoned.

In addition to the above described filter, the invention also relates to a base element which has at least two input terminal contacts and at least two output terminal contacts for connecting the conductors of an electrical line, the input terminal contacts being connected to the output terminal contacts by way of conductor paths. In the base element in accordance with the invention, it is provided that there are at least two longitudinal contacts in each conductor path for electrical connection to a filter component and at least one cross contact. When a filter component is mounted between the two longitudinal contacts, the filter component is placed in the electrical connection between the input terminal contacts and the output terminal contacts, i.e., the electrical connection of the conductor path between the two longitudinal contacts leads via the filter component. The cross contacts can electrically connect the two conductor paths to one another via a filter component when a filter component has been plugged into the cross contacts of two conductor paths.

One preferred configuration of the base element calls for at least three conductor paths to be located on the base element, one of the three conductor paths having at least one cross contact and the other two conductor paths each having at least two longitudinal contacts and at least one cross contact. This arrangement of longitudinal and cross contacts enables flexible contact-making of the three conductor paths among one another, and in two conductor paths at a time by way of the longitudinal contacts also a respective filter component can be placed in the longitudinal extension of the conductor path between the input and output terminal contacts.

The cost for producing the base element is reduced in that, according to a preferred configuration, the conductor paths are made as printed conductors which are preferably vapor-deposited on a plastic base element. Vapor deposition of the printed conductors onto the plastic base element can be automated with little cost so that the production cost is altogether reduced. With respect to other preferred configurations of the base element reference is made to the aforementioned in conjunction with the filter in accordance with the invention.

In particular, there are a host of possibilities for embodying and developing the filter and the base element in accordance with the invention. For this purpose, reference is made to the following detailed description of preferred embodiments in conjunction with the accompanying drawings.

DETAILED DESCRIPTION OF THE INVENTION

Figure 1:
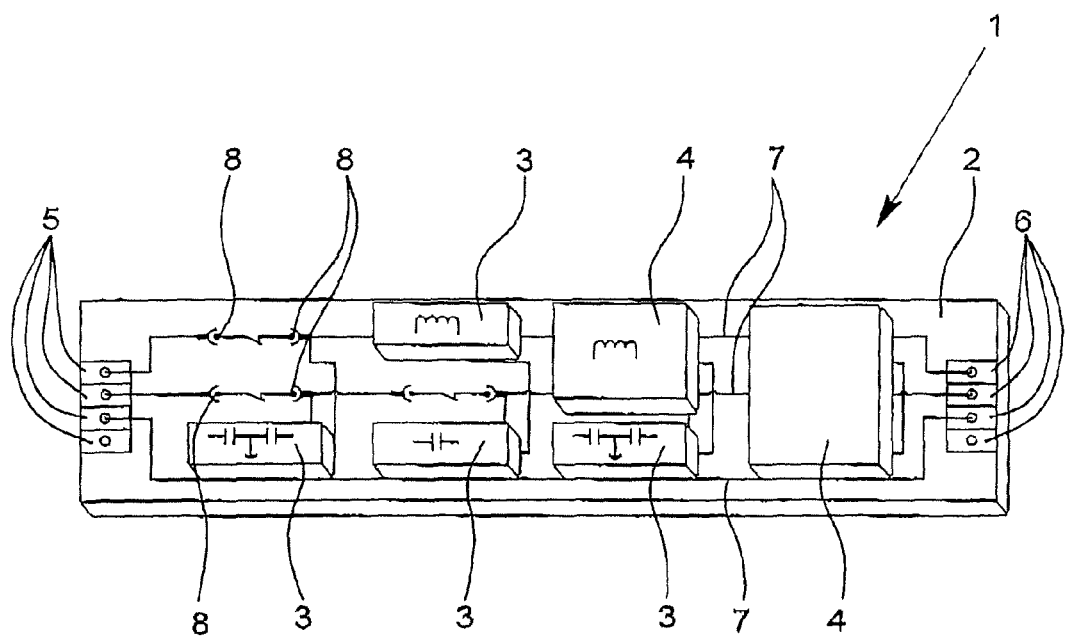
FIG. 1 shows one embodiment of a EMC filter in accordance with the invention for a single-phase network, with the filter components mounted.

FIG. 1 shows an exemplary embodiment of a filter 1 in accordance with the invention with a base element 2, the base element 2 being partially provided with filter components 3 and combination filter components 4, and the base element 2 on the left side having four input terminal contacts 5 and on the right side four output terminal contacts 6. The input terminal contacts 5 are connected to the output terminal contacts 6 by way of three conductor paths 7 which are located on the base element 2. The fourth input terminal contact 5 and the fourth output terminal contact 6 which are not connected to one another via the conductor path enable connection of the base element 2 to ground.

Figure 2:
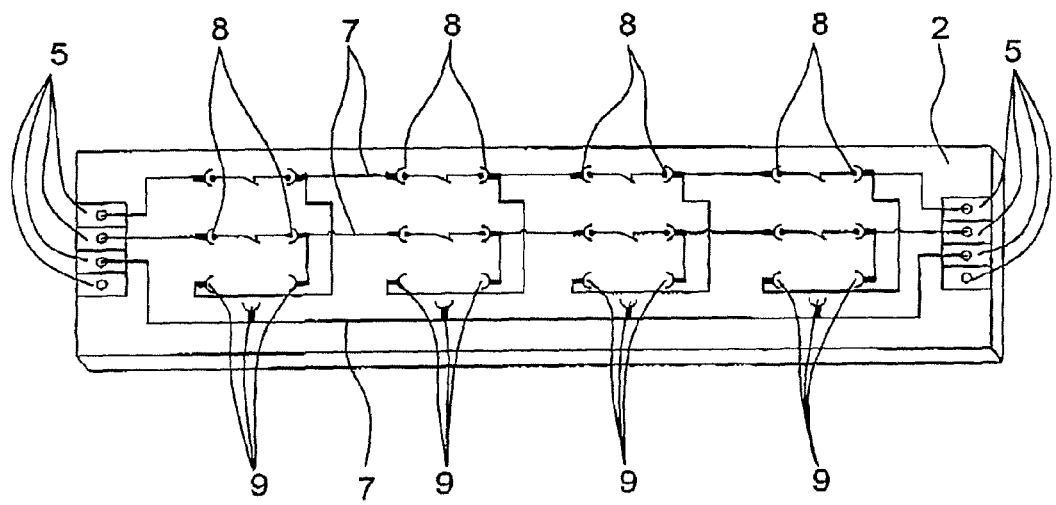
FIG. 2 shows the base element of the EMC filter as shown in FIG. 1.

In the two conductor paths 7 located at the top in FIGS. 1 & 2, there are eight longitudinal contacts 8 each which, in the exemplary embodiment shown in FIG. 1, are partially connected to filter components 3 and to combination filter components 4. Furthermore, in all three conductor paths 4, there are four cross contacts 9, and by way of the cross contacts 9 with the filter component 3 or combination filter component 4 slipped on, a cross connection between the two conductor paths 7 can be established. In the embodiment as shown in FIG. 1, a combination filter component 4 is slipped onto the cross contacts 9 which are shown at far right in the drawings, while a respective filter component 3 is slipped onto the other cross contacts 9 which are located farther to the left. In the exemplary embodiment as shown in FIG. 1, a total of four individual filter components 3 and two combination filter components 4 are slipped onto the base element 2.

One exemplary arrangement of the longitudinal contacts 8 and the cross contacts 9 in the conductor paths 7 can be taken from FIG. 2 in which a base element 2 of a filter 1 is shown without the filter components 3 and without the combination filter components 4. In the configuration of the base element 2 as shown in FIG. 2, the conductor paths 7 can each be connected to one another at four sites via cross contacts 9. The conductor path 7 shown in FIG. 2 as the lowermost has only four cross contacts 9, while the other two conductor paths 7 each have both four cross contacts 9 and also eight longitudinal contacts 8.

Between the two longitudinal contacts 8 of a conductor path 7 which are assigned to one another, a respective break contact is connected so that the longitudinal contacts 8 are electrically connected directly to one another if a filter component 3 or combination filter component 4 has not been slipped on the longitudinal contacts 8. Conversely, if a filter component 3 or combination filter component 4 has been slipped onto the longitudinal contacts 8, the electrical connection leads between the two longitudinal contacts 8 only via the filter component 3 or the combination filter component 4. If an electrical filter component 3 or a combination filter component 4 is slipped onto the cross contacts 9 of at least two conductor paths 7, in this way, the corresponding conductor paths 7 are connected to one another via the filter component 3 or the combination filter component 4. The cross contacts 9 of the conductor paths 7 are thus used for electrical connection between at least two conductor paths 7.

Figure 3:
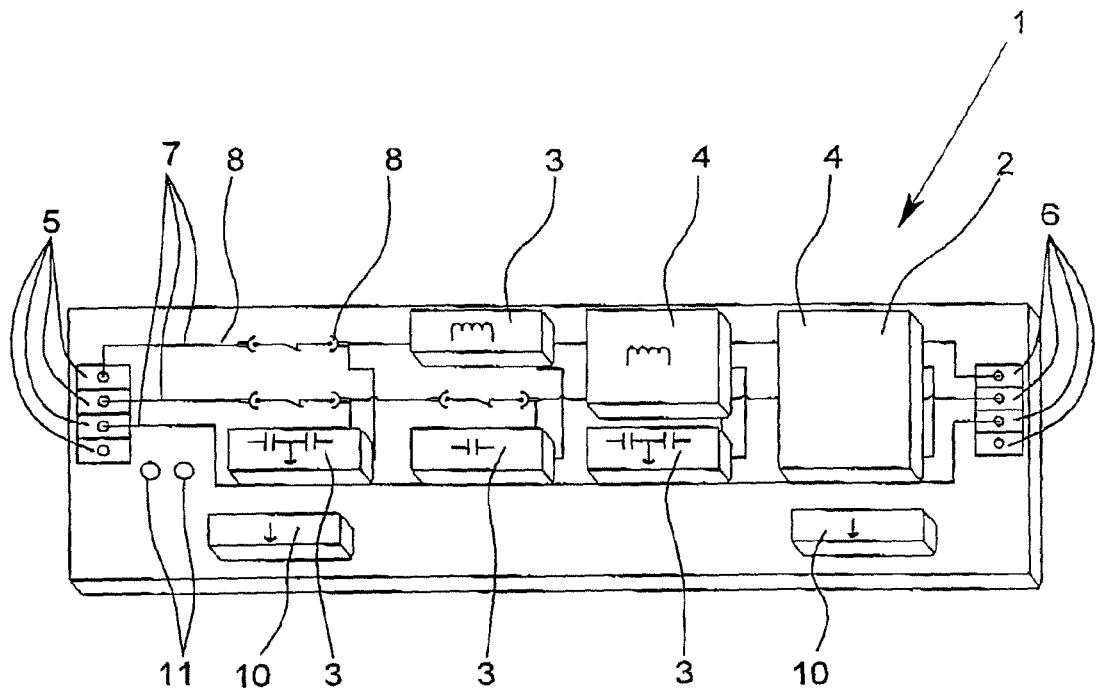
FIG. 3 shows a second embodiment of a EMC filter in accordance with the invention for a single-phase network, with the filter components mounted.
Figure 4:
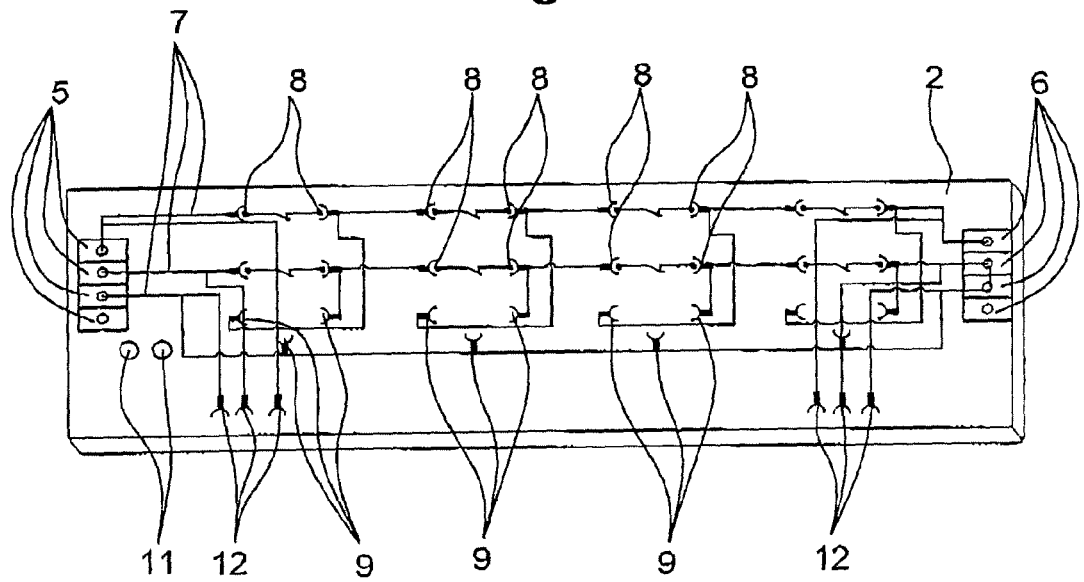
FIG. 4 shows the base element of the EMC filter as shown in FIG. 3.

FIG. 3 shows an exemplary embodiment of the filter 1 in accordance with the invention as shown in FIG. 1, in which in an additional two overvoltage protection elements 10 are slipped onto the base element 2 and protect the conductor paths 7 against overvoltages. Moreover, the base element 2 in addition has two LEDs as display elements 11. Depending on the threshold value or initial value, the display elements 11 signal whether the filter action achieved with the attached filter components 3 or combination filter components 4 is sufficient or not. The overvoltage protection elements 10 are inserted into the overvoltage protection contacts 12 which are shown in FIG. 4, the overvoltage protection contacts 12 each being connected to a conductor path 7. The arrangement of the longitudinal contacts 8 and the cross contacts 9 corresponds to the arrangement described in conjunction with FIG. 2, in the exemplary embodiment as shown in FIGS. 3 & 4, there additionally being the overvoltage protection contacts 12.

The filter components 3 and combination filter components 4, in the illustrated exemplary embodiments, can be slipped onto the base element 2, for which the filter components 3 and the combination filter component 4 have plug pins which correspond to the longitudinal contacts 8 and cross contacts 9 which are made as sockets. The filter 1 as shown in FIG. 3 and the base element 2 as shown in FIG. 4 are, like the filter 1 as shown in FIG. 1 and the base element 2 as shown in FIG. 2, especially suited for single-phase systems in the illustrated embodiments.

Figure 5:
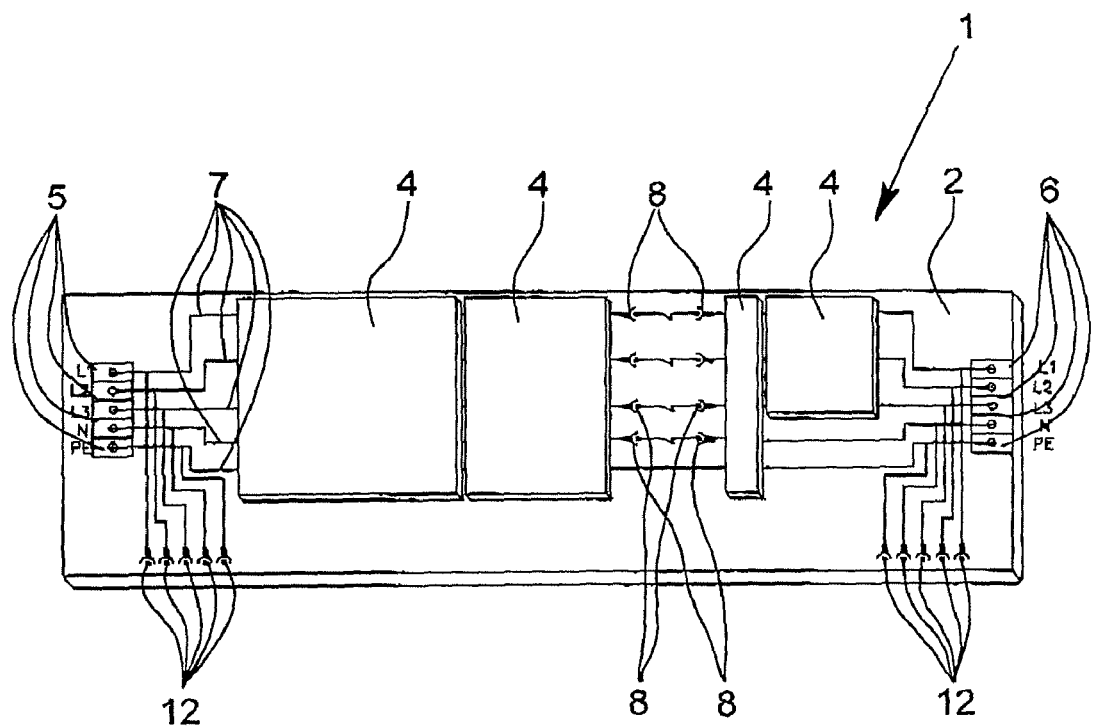
FIG. 5 shows a third embodiment of a EMC filter in accordance with the invention for a three-phase network, with the filter components mounted.
Figure 6:
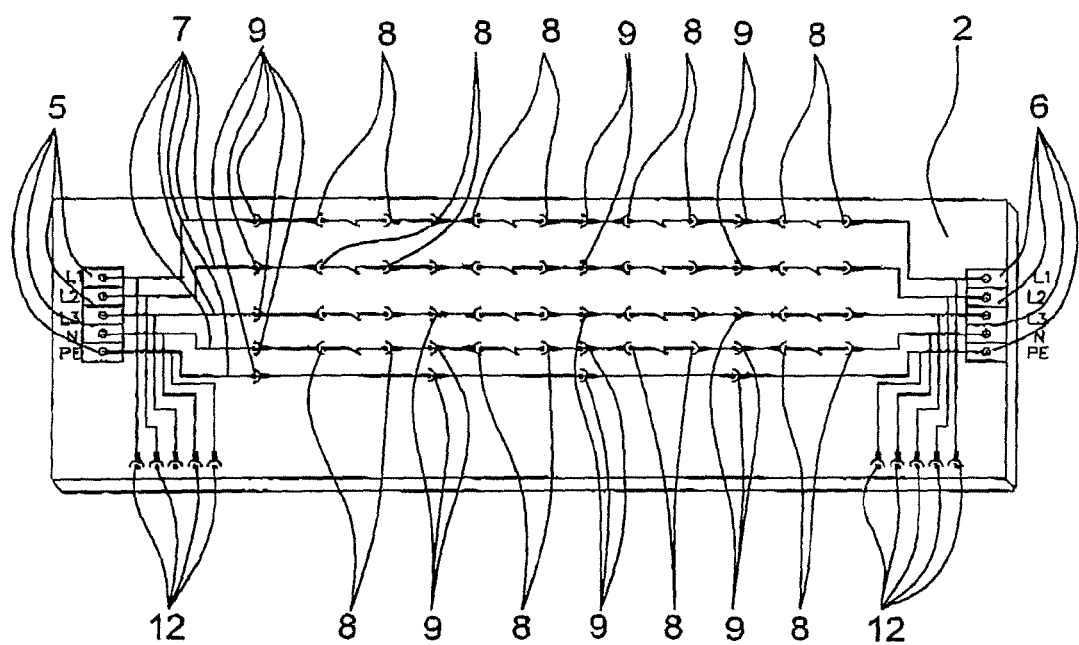
FIG. 6 shows the base element of the EMC filter as shown in FIG. 5.

FIG. 5 shows an embodiment of the filter 1 in accordance with the invention for a three-phase network, in this configuration four combination filter components 4 being slipped onto the base element 2 and each being slipped both onto cross contacts 9 and also longitudinal contacts 8 of the conductor paths 7. According to FIG. 3, in the filter 1 shown in FIG. 5 an overvoltage protection element 10 made as a plug can be slipped onto the overvoltage protection contacts 12 for protection of the conductor paths 7. FIG. 6 shows the base element 2 as shown in FIG. 5 without combination filter components 4. The base element 2 shown in FIGS. 5 & 6, in this embodiment, has five input terminal contacts 5 and five output terminal contacts 6 which are electrically connected to one another by way of five conductor paths 7. The lowermost conductor path 7 shown in the drawings, in this embodiment, has only cross contacts 9, while the four other conductor paths 7 each have both four cross contacts 9 and also eight longitudinal contacts 8. Each of the five conductor paths 7 is connected to two overvoltage protection contacts 12.

What is claimed is:

1. Filter for filtration of electromagnetic interference: comprising:
    a base element with at least at least two electrical filter components, with at least two input terminal contacts and at least two output terminal contacts for connection of conductors of an electric line, the input terminal contacts being connected to the output terminal contacts by way of conductor paths which are located on the base element,
    wherein, in each of two of the conductor paths, there are at least two longitudinal contacts, via which at least one of the filter components is electrically connectable to the respective conductor path such that the electrical connection of the conductor path leads between the two longitudinal contacts by way of the respective filter component, and
    wherein the each of the conductor paths has at least one cross contact so that two conductor paths are electrically connected to one another by way of another one of the filter components when the another one of the filter components is electrically connected to the cross contacts of two of the conductor paths, wherein, between the at least two longitudinal contacts of each conductor path, there is a direct electrically conductive connection when a filter component is not connected to the two longitudinal contacts which is interrupted when a filter component is connected.

2. Filter in accordance with claim 1, wherein there is another conductor path on the base element, and wherein, in the other conductor path, there is at least one cross contact so that the other conductor path is electrically connected to one of said two of the conductor paths by way of a respective filter component when the filter component is electrically connected to the cross contacts of the other conductor path and said one of the two conductor paths.

3. Filter in accordance with claim 1, wherein there are altogether three conductor paths on the base element, two of the conductor paths having both said longitudinal contacts and said cross contacts and the other of the conductor paths having only cross contacts, the conductor path which has only cross contacts be electrically connectable via at least one filter component to said two of the conductor paths.

4. Filter in accordance with claim 3, wherein the conductor paths which have both longitudinal contacts and cross contacts are electrically connectable both to the conductor path which has only cross contacts and also among one another via at least one of the filter components.

5. Filter in accordance with claim 1, wherein there are altogether five conductor paths on the base element, four of the conductor paths having both longitudinal contacts and also cross contacts and one of the conductor paths having only cross contacts, the conductor path which has only cross contacts being electrically connectable via at least one of the filter components to the four other conductor paths.

6. Filter in accordance with claim 5, wherein the conductor paths which have both longitudinal contacts and cross contacts are electrically connectable both to the conductor path which has only cross contacts and also among one another via at least one of the filter components.

7. Filter in accordance with claim 1, wherein the at least one of the filter components comprises at least one of a capacitance, an inductance, and a resistance.

8. Filter in accordance with claim 7, wherein at least one of a capacitance, an inductance, and a resistance is adjustable.

9. Filter in accordance with claim 1, wherein the longitudinal contacts and the cross contacts are plug-in contacts, and the filter components have corresponding mating plug-in contacts.

10. Filter in accordance with claim 9, wherein the input terminal contacts and the output terminal contacts are plug-in contacts.

11. Filter in accordance with claim 10, wherein the conductor paths are printed conductors.

12. Filter in accordance with claim 1, wherein the base element is mountable on a mounting rail.

13. Filter in accordance with claim 1, wherein the base element is connected to at least one overvoltage protection element which protects the conductor paths against overvoltages.

14. Filter in accordance with claim 1, wherein the base element has at least one display element, which displays filter action depending on the type, number and position of the filter components which have been mounted on at least one of the longitudinal contacts and the cross contacts.

15. Filter in accordance with claim 1, wherein a cover is mountable on the base element, the cover being made of a plastic which has been vapor-deposited with a metal layer.

16. Base element for a filter comprising,
at least two input terminal contacts and at least two output terminal contacts for connection of conductors of an electric line, the input terminal contacts being connected to the output terminal contacts by way of conductor paths which are located on the base element,
wherein, in each of two of the conductor paths, there are at least two longitudinal contacts, via which a respective filter component is electrically connectable to the respective conductor path such that the electrical connection of the conductor path leads between the two longitudinal contacts by way of the respective filter component, and
wherein the each of the conductor paths has at least one cross contact so that two conductor paths are electrically connectable to one another by way of another filter component when the another filter component is electrically connected to the cross contacts of two of the conductor paths,
wherein, between the at least two longitudinal contacts of each conductor path, there is a direct electrically conductive connection when a filter component is not connected to the two longitudinal contacts which is interrupted when a filter component is connected.

17. Base element in accordance with claim 16, wherein there are three conductor paths on the base element, one conductor path having only cross contacts and the other conductor paths having both longitudinal contacts and also cross contacts.

18. Base element in accordance with claim 16, wherein the longitudinal contacts, the cross contacts, the input terminal contacts and the output terminal contacts are plug-in contacts.

19. Base element in accordance with claim 16, wherein the conductor paths are printed conductors.

20. Base element in accordance with claim 16, wherein there is at least one overvoltage protection element which protects the individual conductor paths against overvoltages, and the overvoltage protection element are connectable by way of a mounting foot to a mounting rail onto which the base element is lockable.

* * * * *